United States Patent [19]

Ito et al.

[11] Patent Number: 5,210,407
[45] Date of Patent: May 11, 1993

[54] ELECTRIC FIELD INTENSITY DETECTING DEVICE HAVING A CONDENSER-TYPE ANTENNA AND A LIGHT MODULATOR

[75] Inventors: Hiroshi Ito, Kasugai; Tadashi Ichikawa; Satoru Kato, both of Aichi, all of Japan

[73] Assignee: Kabushiki Kaisha Toyota Chuo Kenkyusho, Aichi, Japan

[21] Appl. No.: 879,424

[22] Filed: May 7, 1992

[30] Foreign Application Priority Data

May 7, 1991 [JP] Japan .................................. 3-131930

[51] Int. Cl.$^5$ .............................................. H01J 5/16
[52] U.S. Cl. ................................ 250/227.11; 324/96; 343/703
[58] Field of Search ........................ 250/227.11, 227.21, 250/227.19; 324/96, 244.1; 343/703, 794, 795

[56] References Cited

U.S. PATENT DOCUMENTS 4,070,621  1/1978  Bassen et al. ..................... 324/96
4,132,992  1/1979  Perrotti ............................. 343/703

Primary Examiner—David C. Nelms
Assistant Examiner—Que T. Le
Attorney, Agent, or Firm—Oblon, Spivak, McClelland, Maier & Neustadt

[57] ABSTRACT

An apparatus measures the intensity of an electric field with a compact sensor equipped with a light modulater of a Mach-zender interferometer type and a condenser-type antenna. The sensor modulates coherent measuring lights propagated through branched two optical paths according to the voltage induced on the surfaces of plates of a condenser-type antenna of the sensor. The modulated lights are merged and interfered with each other and result in merged light different in intensity from the original measuring light. A waveguide-type optical integrated circuit formed in the sensor calculates the intensity of the merged light having the intensity dependent on the intensity of the magnetic field.

12 Claims, 7 Drawing Sheets

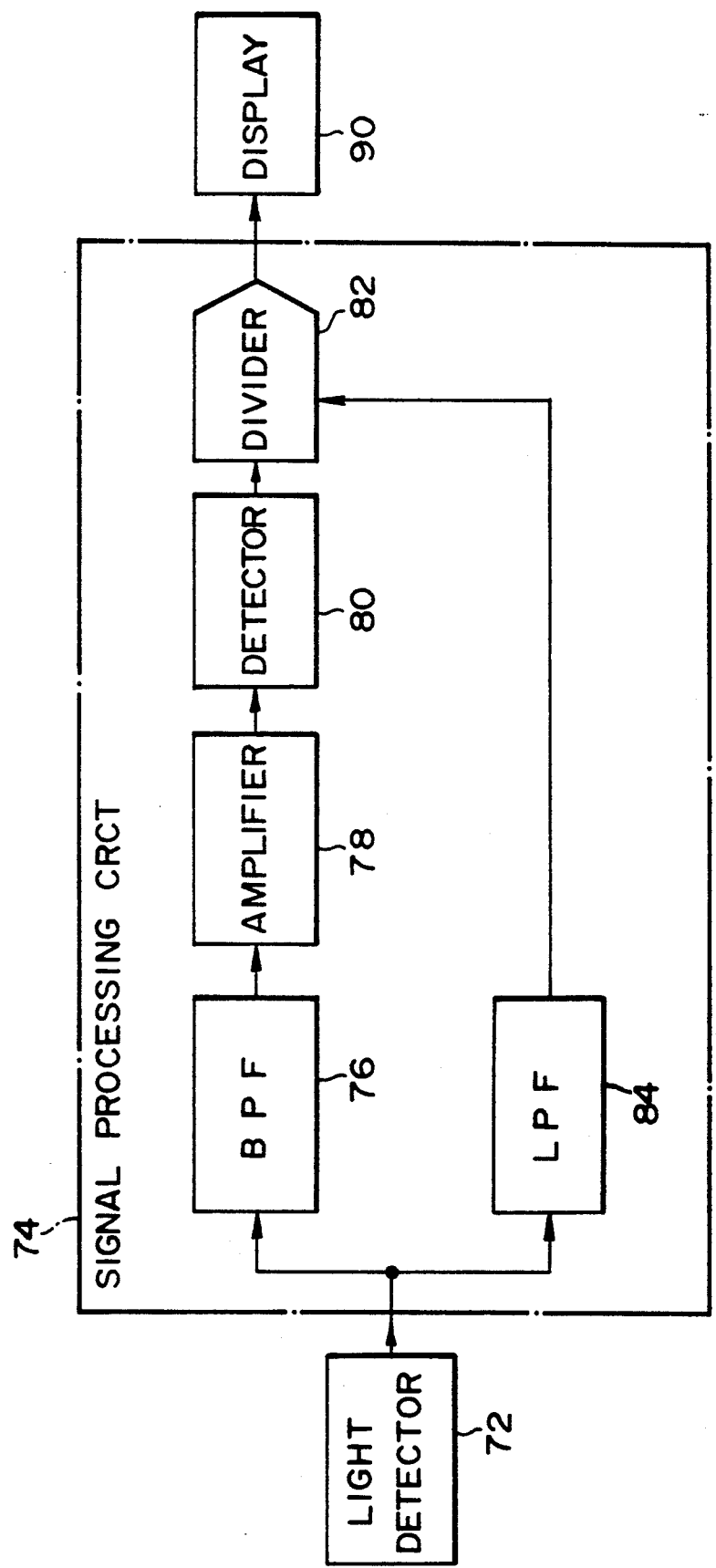

ELECTRIC FIELD INTENSITY DETECTING DEVICE HAVING A CONDENSER-TYPE ANTENNA AND A LIGHT MODULATOR

BACKGROUND OF THE INVENTION

1. Field of the Invention

This invention relates to an electromagnetic field intensity measuring apparatus, and more particularly to such an apparatus for optically measuring the intensity of an electric field.

2. Description of the Related Art

Electric waves are currently widely used in a variety of fields. Especially, today's computerization trend increases more and more the importance of electric waves as information transmitting media for broadcasting and communications. In the other fields, electric waves are prevailing widely as energy media e.g. in semiconductor manufacturing apparatuses, plasma heating process, etc. At present, it is necessary to understand accurately the detail of an electric field in order to develop the technology making use of it. Meanwhile damages to various electronic equipments caused by electric waves is being outstanding as a serious problem. To take measures against electric interference, abbreviated to EMI, it is necessary to accurately analyze the state of the electric field.

Much progress has therefore been made in the development and practical use of various kinds of electric intensity measuring apparatuses. In such a typical conventional apparatus, a sensor is installed in an electric field measuring place for measuring the intensity of an electric field. The sensor should be installed so as not to disturb an electric field to be measured and should be small in size so that the electric field can be measured in a small space.

However, the conventional electric field intensity measuring apparatus equipped with the sensor does not satisfy this demand. Further it is impossible to accurately measure the intensity of a low-frequency electric field by using a small-size sensor, especially such as commercial cycles.

In one example of the conventional electric field intensity measuring apparatus, a probe antenna serving as a sensor is installed in the electric field place, and the obtained electrical signal is transmitted to a detector circuit, which is installed outside the electric field to be measured, via a metallic conductive cable.

However, a metallic cable prevents not only freely moving and installing the probe antenna, but also measuring accurately the intensity of the electric field by disturbance.

In an effort to solve this problem, an electric field intensity measuring apparatus using electro-optic crystal such as $LiNbO_3$ has been proposed.

One example of the electric field intensity measuring apparatus is shown in FIG. 8. This conventional apparatus comprises a sensor 10 disposed in an electric field measuring place 100, a light source 12 disposed outside of the measuring place 100, and a photo detector 14. The sensor 10 is optically connected with the light source 12 and the photo detector 14 via an up-link optical fiber 16 for inputting measuring light and a down-link optical fiber 18 for outputting modulated light, respectively.

The sensor 10 includes a polarizer 20, an electro-optic crystal 22, an analyzer 24, probe antennas 26a, 26b, and a pair of electrodes 28a, 28b mounted on opposite side surfaces of the electro-optic crystal 22. The electrodes 28a, 28b are connected to the antennas 26a, 26b, respectively.

When measuring an electric field with the conventional apparatus, measuring light is outputted from the light source 12 to the sensor 10 via the optical fiber 16.

The electro-optic crystal 22 constituting the main part of the sensor 10 is cut along the X axis, Y axis and Z axis, as shown in FIG. 8, so that the measuring light from the light source 12 are propagated in the direction of the X axis as a linear polarization light wave inclined by 45° with respect to the Y axis by the polarizer 20. Therefore the light wave incident on the electro-optic crystal 22 via the polarizer 20 is decomposed into normal light (Y axis) and abnormal light (Z axis), which are then propagated independently of one another.

At that time the electric field detected by the antennas 26a, 26b is applied between the electrodes 28a, 28b as a potential difference. By an electro-optic effect of the crystal 22 resulting from this potential difference, the refractive index with respect to the abnormal light varies to cause a phase difference between the two light wave components, i.e. normal light and abnormal light, passed through the electro-optic crystal 22. This phase difference is then detected by the analyzer 24 disposed perpendicularly to the polarizer 20. Namely, when there is no phase difference, the measuring light will remain its initial linear state so that the quantity of light passing the analyzer 24 is zero. However, when a phase difference is caused due to the electric field, the light wave will be elliptically polarized to generate a light wave component to pass the analyzer 24. Since the quantity of light passing the analyzer 24 is determined by the applied potential difference, it is possible to measure the potential difference applied to the electro-optic crystal 22, i.e. the intensity of the electric field, by directing the light, which passed the analyzer 24, to the photo detector 14 via the optical fiber 18 and then measuring the amount of the light passed the analyzer 24.

In this conventional electric field intensity measuring apparatus, since the sensor 10 and the optical fibers 16, 18 are chiefly made of dielectric, it is possible to measure the intensity of an electric field accurately, with substantially no disturbance with the electric field in the electric field measuring place 100.

However, this conventional apparatus has a problem that the antennas 26a, 26b of the sensor 10 cannot detect the intensity of low-frequency electric field. If normal dipole antennas are used as the antennas 26a, 26b, it requires a huge length in order to detect a low-frequency electric field, thus making the sensor too large in size and hence not practical. Thus with the small sensor 10 of the conventional apparatus, it is impossible to measure the intensity of a low-frequency electric field, especially the intensity of an electric field near commercial cycles (50 Hz, 60 Hz).

Further, since the bulk crystal 22 is used as the main part of the sensor 10, the conventional apparatus is remarkably low in sensitivity of measuring an electric field so that it is difficult to measure the intensity of a very weak electric field. Yet with an ultra-small crystal 22 of 1 mm squares, a voltage of 300 V is required in order to change the phase of light passing such crystal 22 by 180°. Therefore it is very difficult to measure the intensity of a very weak electric field, depending on the gain of the antennas 26a, 26b.

SUMMARY OF THE INVENTION

It is therefore an object of this invention to provide an apparatus for measuring the intensity of an electric field, especially of a low frequency, without disturbing the field. It is a further object to provide a small-size sensor with high sensitivity.

According to this invention, there is provided an apparatus for measuring an electric field intensity comprising: light generating means for generating coherent measuring light; a sensor disposed in the electric field for modulating a measuring light according to the intensity of the electric field and for outputting said modulated light; an up-link optical fiber connecting between said light generating means and said sensor for guiding said measuring light into said sensor; a down-link optical fiber for guiding said modulated light outside said sensor; and intensity processing means disposed outside said sensor for processing said intensity of the electric field based on the degree of modulation of said measuring light inputted via said down-link optical fiber; wherein said sensor comprises a condenser-type antenna for detecting the electric field and outputting a voltage according to the intensity of the detected electric field, a waveguide-type optical integrated circuit in which a waveguide for propagating the inputted measuring light is formed, a light modulator, through which said waveguide extends, formed in said optical integrated circuit, and a light modulator electrode for applying the output voltage of said condenser-type antenna to said waveguide of said light modulator, whereby the measuring light is modulated according to the intensity of the electric field while the measuring light is propagated through said waveguide of said light modulator.

The light generating means preferably includes a laser light source for outputting coherent laser light, and an optical system for directing the inputted laser light to said up-link optical fiber.

The laser light source may be any arbitrary laser such as HeNe laser, YAG laser and semiconductor laser, but it should preferably be a semiconductor laser in view of compatibility with the optical fibers.

The up-link optical fiber may be any of various fibers such as multimode fiber (MMF), singlemode fiber (SMF) and polarization maintaining fiber (PMF), but it should preferably be a polarization maintaining fiber (PMF) in view of functional stability and utilization of light.

The material of the light integrated circuit is exemplified by a ferroelectric material such as $LiNbO_3$ or $LiTaO_3$, a semiconductor such as GaAlAs or Si, and a non-crystalline material such as $SiO_2$ or $Si_3N_4$, and should preferably be $LiNbO_3$, which has a good electro-optical effect The light modulator formed in the waveguide-type optical integrated circuit may be any of various types such as Mach-Zender type, directional coupler type and cross type.

The condenser-type antenna may be any of various forms according to need and may be, for example, a pair of confronting metallic plates of a suitable size. The condenser-type antenna may be an integrated antenna formed on the substrate of the optical integrated circuit by photolithography and the like, so that the entire sensor could be compact.

The down-link optical fiber may be any of various forms, but should preferably be a singlemode fiber for eliminating unnecessary light such as scattered noise light in the waveguide and modal noise light.

The above-mentioned measuring apparatus operates as follows.

When measuring an electric field by using this measuring apparatus, the sensor is installed in the electric field measuring place, and the light generating means and the intensity processing means are installed outside the sensor.

The light generating means outputs coherent measuring light to the sensor via the optical fiber.

The sensor includes an antenna and an optical integrated circuit in which a waveguide is formed. The antenna is a condenser-type antenna. The output voltage of the condenser-type antenna is applied to the waveguide by the light modulation electrode to modulate the measuring light passing through the waveguide.

Since the measuring light passing through the light modulator is modulated according to the intensity of the external electric field detected by the antenna, it is possible to measure the intensity of the electric field by measuring the degree of modulation of the measuring light.

By using a condenser-type antenna, the present invention enables a small-size antenna to detect even a low-frequency electric field with good sensitivity and enough intensity. Therefore it is possible to measure the intensity of a low-frequency electric field precisely by using a small-size sensor.

One of the examples of the condenser-type antenna is shown in FIG. 3. The antenna comprises a pair of confronting antenna metal plates 34a, 34b. Theoretical background is described below.

Assuming that the external low-frequency electric field to be measured is $E_9$, a quantity of electric charge Q expressed by the following equation is generated on one side surface of each of a pair of antenna metallic plates 34a, 34b constituting the antenna.

$$Q = \epsilon_0 \cdot S \cdot \vec{E}_s \qquad (1)$$

S stands for an area of the antenna metallic plates 34a, 34b, and $\epsilon_0$ stands for a dielectric constant in vacua.

FIG. 5A shows the pair of metallic plates 34a, 34b of the antenna with no external circuit connected thereto. FIG. 5B schematically shows the pair of metallic plates 34a, 34b of the antenna with the electrodes 36a, 36b connected thereto as an external circuit. The electrodes 36a, 36b apply a voltage, which is outputted from the metallic plates 34a, 34b of the antenna, to the waveguides 48a, 48b formed in the light modulator 42.

If no external circuit is connected to the metallic plates 34a, 34b of the antenna as shown in FIG. 5A, electric charges of the same quantity and of different signs are produced on these metallic plates of the antenna not only at their front surfaces but also at their rear surfaces. On the contrary, if the electrodes 36a, 36b as an external circuit are connected to the pair of metallic plates 34a, 34b of the antenna as shown in FIG. 5B, a capacity $C_a$ to be formed between the two metallic plates 34a, 34b of the antenna will have a value small by far, compared to a capacity $C_m$ to be formed between the two electrodes 36a, 36b. Since the metallic plates 34a, 34b of the antenna are connected with the electrodes 36a, 36b, they will have the same potential. Using a voltage $V_s$ to be outputted from the pair of metallic plates 34a, 34b of the antenna, the above equation (1) is represented by the following equation:

$$Q = C_m V_s + C_a V_s \approx C_m V_s \qquad (2)$$

Namely, as shown in FIG. 5B, most of electric charges to be produced are concentrated between the pair of electrodes 36a, 36b. Therefore, in a low-frequency electric field, in which an electric field at the electric field measuring place varies gently, a current i flows between the metallic plates 34a, 34b of the antenna via the light modulator 42. At that time the impedance Z of the light modulator 42 will be as follows:

$$Z = R/(1 + j\omega C_m R)$$

where R stands for a resistance of the light modulator and $\omega$ stands for an angular frequency of the electric field.

Therefore, the voltage $V_s$ to be produced between the metallic plates 34a, 34b of the antenna is expressed by the following equation:

$$V_s = iZ = \frac{j\omega C_m R}{1 + j\omega C_m R} \cdot \frac{\epsilon_0 S}{C_m} \cdot \vec{E_s} \qquad (3)$$

As is apparent from this equation, a lower cut-off frequency is $$(\tfrac{1}{2}\pi C_m R)$$

and is therefore determined by the values of $C_m$ and R.

Here the impedance between the light modulation electrodes 36a, 36b of the waveguide-type optical integrated circuit 40 is very high. Although the capacity (capacity between the waveguides 48a, 48b) $C_m$ of the light modulator 36 is the order of $10^{-12}$ F., the resistance R between the modulation electrodes 36a, 36b may be more than $10^{10}$ Ω. Therefore the lower cut-off frequency of the electric field detection can easily decrease less than 10 Hz.

According to the above equation (3, the sensitivity of the electric field detection is represented by $\epsilon_0 S/C_m$. As is apparent from this equation, the distance between the metallic plates 34a, 34b of the antenna is not included in the detection sensitivity; this means that the effective length of the antennas determines the sensitivity and that the metallic plates 34a, 34b of the antenna can be reduced to a very small size although the ordinary dipole antennas must be very long to get enough sensitivity in low frequency.

According to this apparatus, since the antennas can be reduced to a very small size, it is possible to downsize the low-frequency electric field measuring sensor adequately.

In the sensor of this invention, when a voltage $V_s$ according to the intensity of the external electric field is outputted from a pair of metallic plates 34a, 34b of the antenna, which constitutes a condenser-type antenna, this output voltage $V_s$ is applied between the light modulation electrodes 36a, 36b to vary the refractive index of the waveguide 48 in the modulator 42 by the electro-optic effect caused by this voltage $V_s$. As a result, the measuring light passing this sensor will be modulated according to the intensity of the external electric field.

The measuring light passed through the light modulator is outputted to the intensity processing means via the waveguide and optical fiber. The intensity processing means calculates the intensity of the electric field in the electric field measuring place based on the degree of modulation of this measuring light.

By using a condenser-type antenna as an electric field intensity detecting antenna, it is possible to measure the intensity of the electric field in the electric measuring field with high sensitivity. Especially since the lower cut-off frequency during detecting the electric field can be less than 10 Hz according to need, it is possible to accurately measure the intensity of a low-frequency electric field.

As described above, according to this invention, it is possible to optically measure the intensity of an electric field in the low frequency region accurately with high sensitivity. Since a condenser-type antenna is used as an antenna, it is possible to reduce the sensor, which is to be installed in the electric field measuring place, to an adequately small size and also it is possible to measure the intensity of an electric field in the low frequency region near d.c. and the intensity of an electric field in the commercial frequency region, which were difficult to measure with the conventional small-size sensor.

In the electric field intensity measuring apparatus of this invention, the light modulator should preferably be formed as follows to be a Mach-Zender interferometer type.

Namely, the waveguide is branched at a branch point into a first modulation waveguide and a second waveguide and merges at a merging point, and the light modulator electrodes are formed so that the voltage which is outputted from the condenser-type antenna, could be applied to the first and reversely to second modulation waveguides. The applied voltage modulates the phase of the measuring light to be propagated through the respective modulation waveguides and for causing the positive and negative voltage signals to merge and interfere with one another at the merging point, thereby outputting the merging light whose intensity is modulated according to the electric field intensity.

With this arrangement, the measuring light introduced into the waveguide via the optical fiber branches off to propagate into the first and second modulation waveguides, and the branched light waves merge and interfere with one another at the merging point.

The light modulator has such a construction that a voltage signal to be outputted from the antenna is applied to the first and second modulation waveguides. Therefore, when the antenna outputs a voltage according to the intensity of the external electric field, this voltage is applied to the first and second modulation waveguides to change the refractive index of the respective waveguide, thus changing the phase of each of the light waves being propagated in the first and second modulation waveguides.

At that time, since to the first and second modulation waveguides voltages of opposite signs are applied, the light waves being propagated in the respecsttive waveguides will have opposite signs in phase to cause a phase difference. When the measuring light branches passed through the first and second modulation waveguides merge and interfere with one another at the merging point, the degree of change of phase will be converted into an intensity of light.

When there is no external electric field, the intensity of the measuring light to be outputted from the intensity modulator will be maximal, and when the phase difference is 180°, the amount of the measuring light will be minimal. Therefore, by measuring the intensity of the measuring light modulated by and outputted from the light modulator, it is possible to measure the degree of phase difference and hence the electric field intensity accurately.

BRIEF DESCRIPTION OF THE DRAWINGS

FIG. 4 is a block diagram showing a signal processing circuit of FIG. 2;

DETAILED DESCRIPTION

A preferred embodiment of this invention will now be described with reference to the accompanying drawings.

Figure 2:
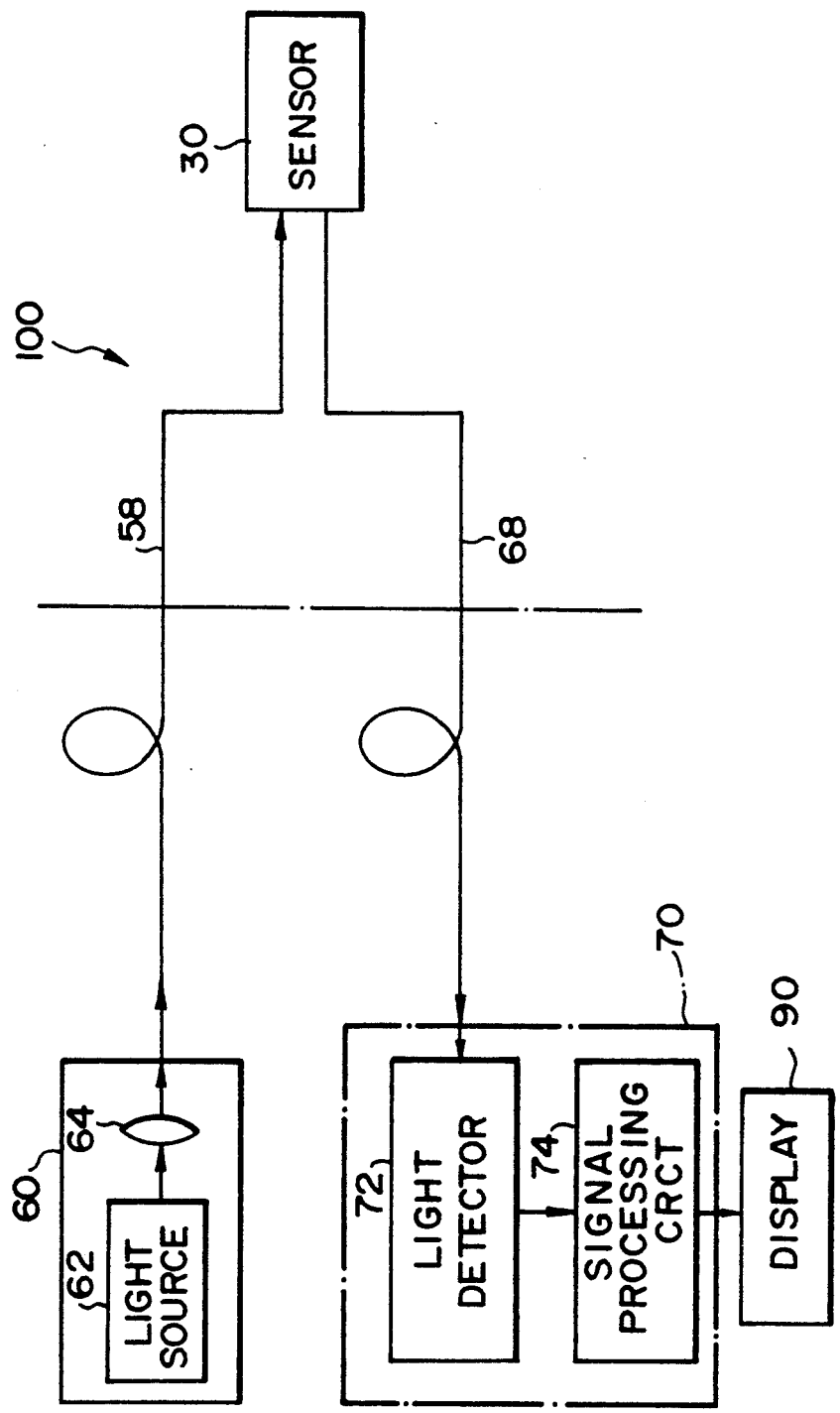
FIG. 2 is a block diagram showing the apparatus for measuring an electric field intensity using the sensor of FIG. 1.

FIG. 2 shows an apparatus for measuring an electric field intensity according to this embodiment. The apparatus generally comprises a sensor 30 adapted to be installed in an electric field measuring place 100, a measuring light generator 60 adapted to be installed outside the electric field measuring place 100, an electric field intensity processing circuit 70, and a display 90.

The measuring light generator 60 and the sensor 30 are optically connected with one another via a uplink optical fiber 58. The sensor 30 and the electric field intensity processing circuit 70 are optically connected with one another via a down-link optical fiber 68 for outputting modulated light.

The measuring light generator 60, which is operable to output coherent measuring light, includes a laser light source 62, and an optical system 64 composed of lenses or the like for directing the laser light to the optical fiber 58. As the laser light source 62, a semiconductor laser is used in view of compatibility with the optical fibers. In this embodiment, as the optical fiber 58, a polarization maintaining fiber is used in view of effective use of light and stability.

Figure 1:
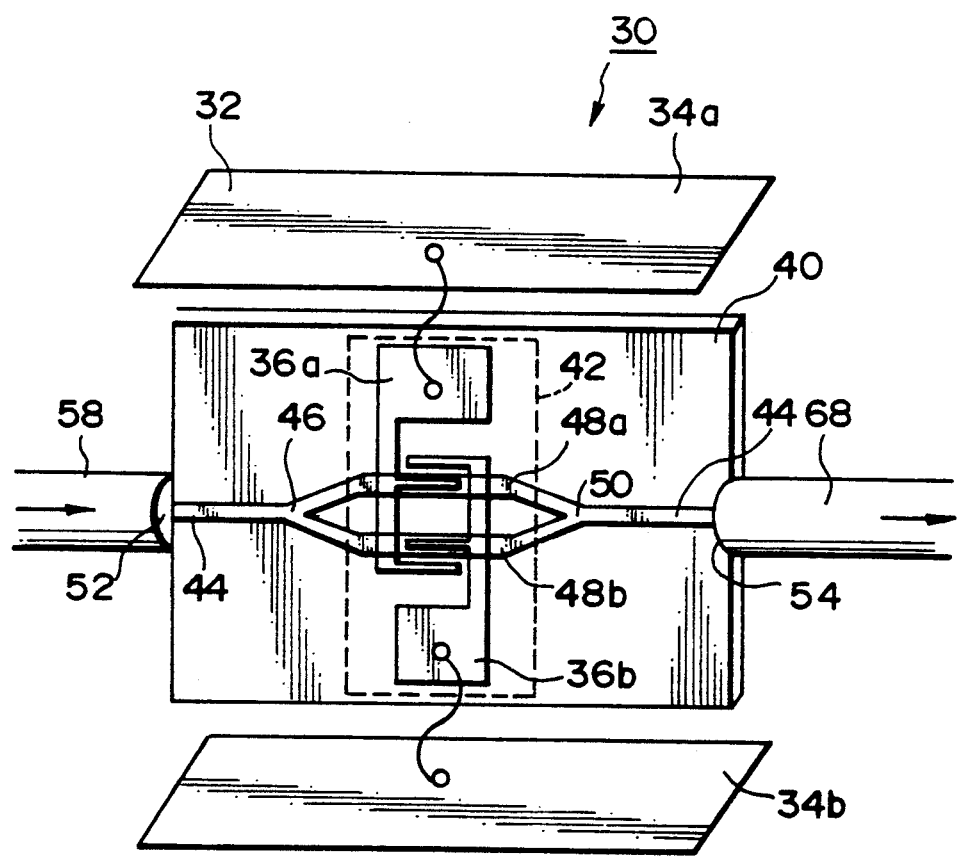
FIG. 1 is a diagram showing a sensor of an apparatus for measuring an electric field intensity of this invention.

FIG. 1 shows the definite structure of the sensor 30. The sensor 30 includes an antenna 32 for outputting a voltage signal according to the intensity of an electric field to be measured, and a waveguide-type optical integrated circuit 40 having a light modulator 42 for modulating the intensity of the passing light by the voltage.

In the optical integrated circuit 40, a waveguide 44 to which the measuring light is to be introduced via the optical fiber 58 is formed. The waveguide 44 is branched at a branch point 46 into a first modulation waveguide 48a and a second modulation waveguide 48b and merges at a merging point 50 into the single waveguide 44 again.

The light modulator 42 is a waveguide-type light intensity modulator formed on the substrate of the optical integrated circuit 40 by photolithography. In this embodiment, this light modulator 42 is a Mach-Zender interferometer type.

The material of the optical integrated circuit 40 is LiNbO$_3$, which produces an electro-optic effect. The waveguides 44, 48a and 48b have a refractive index higher than the material therearound so as to confine the light waves in said waveguide.

The antenna 32 detects an electric field and outputs a voltage signal according to the intensity of the electric field. The antenna 32 is a condenser-type antenna consisting of a pair of confronting metallic plates 34a, 34b of the antenna. The pair of metallic plates 34a, 34b of the antenna is formed in the substrate of the optical integrated circuit 40 as an integrated condenser antenna by photolithography and the like.

Since the optical integrated circuit 40 and the metallic plates 34a, 34b of the antenna are integrally and compactly formed on the common substrate, the sensor 30 is very easy to handle.

Figure 6:
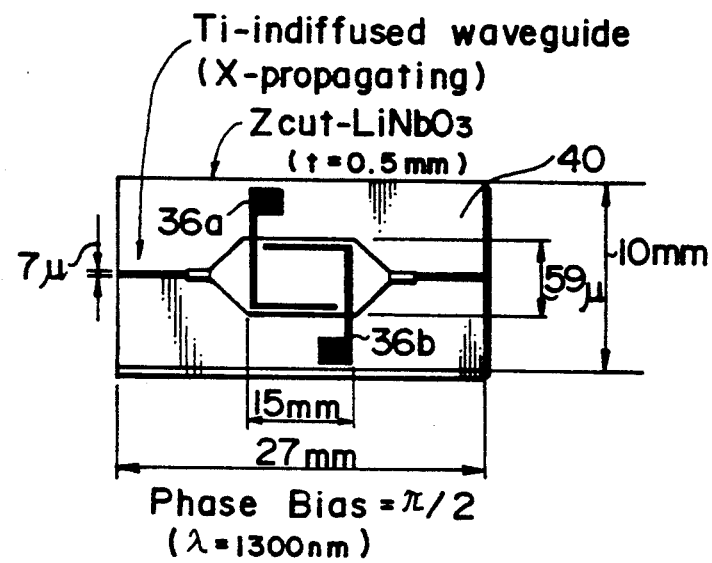
FIG. 6 is a diagram showing measurements of the sensor.
Figure 7:
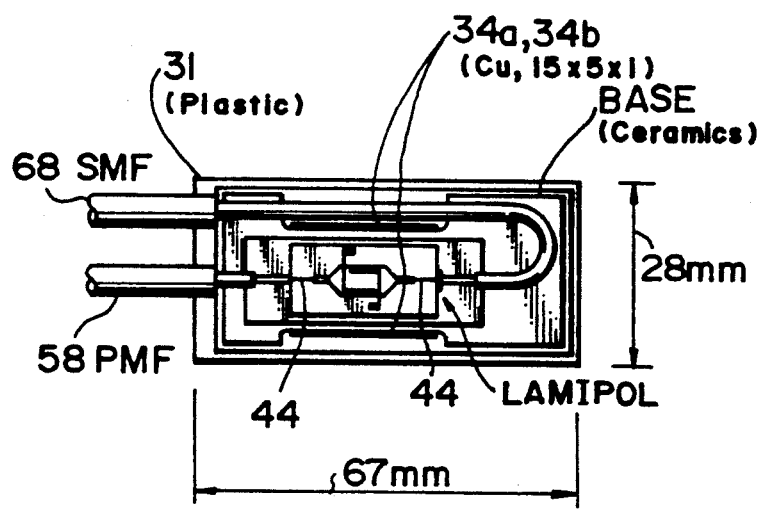
FIG. 7 is a view showing the structure of the sensor.

FIG. 6 shows the practical measurements of the optical integrated circuit 40 of this embodiment, and FIG. 7 shows the practical structure of the sensor 30 using the optical integrated circuit 40 of FIG. 6. The waveguide 44 and the optical fibers 58, 68 are interconnected by butt joint. In order to provide a cantilever structure, which is practically convenient, the output optical fiber 68 is bent to lead in the same direction as the up-link optical fiber 58.

As each of the metallic plates 34a, 34b of the antenna, a copper plate of 75 mm$^2$ (5×15) is used. The mount of every other part is dielectric; the substrate of the optical integrated circuit 40 is made of alumina ceramics; and a casing 31 is made of polycarbonate resin. Assembling of the parts is completed by means of adhesive or screws of polycarbonate resin.

The voltage signals of opposite signs according to the electric field intensity outputted from the pair of metallic plates 34a, 34b of the antenna are applied to the first and second modulation waveguides 48a, 48b in the light modulator 42 via electrodes 36a, 36b.

Therefore the refractive index of each waveguide 48a, 48b varies according to the intensity of the electric field so that the phase of the light wave being propagated in it will vary.

Since the voltage signals of opposite signs are applied to the first and second modulation waveguides 48a, 48b, the sign of the phase of the light wave propagating in the first modulation waveguide 48a is opposite to the light wave propagating in the second modulation waveguide 48b, thus causing a phase difference therebetween. The light waves propagated through the waveguides 48a, 48b merge and interfere with one another at the merging point 50, and the degree of the phase difference is converted into the intensity of light. The merged light is outputted from the output terminal 54 to an intensity processing circuit 70 via the optical fiber 68 as the modulated light. Although the optical fiber 68, like the optical fiber 58, may be any of various kinds of optical fibers, a singlemode fiber is used in this embodiment.

The electric field intensity processing circuit 70 includes a photo detector 72 and a signal processing circuit 74. The photo detector 72 converts the modulated measuring light, which is inputted via the optical fiber 68, into an electrical signal to be outputted to the signal processing circuit 74. The signal processing circuit 74 calculates the intensity of the electric field in the measuring place 100 based on the inputted electrical signal. The obtained intensity indicated on a display 90.

FIG. 4 shows one example of the signal processing circuit 74, in which the intensity of an electric field of a constant low frequency is calculated.

Namely, a signal outputted from the photo detector 72 is inputted to a band-pass filter 76 and a lowpass filter 84. The band-pass filter 76 extracts from the inputted signal a desired frequency component to be measured and outputs it, as a numerator, to a divider 82 via an amplifier 78 and a detector 80.

Meanwhile the low-pass filter 84 extracts a d.c. component from the inputted signal and outputs it, as a denominator, to the divider 82. This d.c. component represents fluctuation of light intensity of the measuring light generator 60 and fluctuation of propagation loss in the optical fibers 58, 68.

The divider 82 divides the inputted signal to eliminate fluctuating components due to disturbance and displays the result of this process on the display 90. The result of process on display indicates the electric field intensity accurately as it is free from any fluctuating component due to disturbance.

The operation of the measuring apparatus will now be described.

When coherent laser light is outputted from the laser light source 62, the laser light is focused by the optical system 64 and is inputted into the optical fiber 58. The measuring light propagated in the optical fiber 58 reaches the sensor 30, falls on the waveguide 44 from an input portion 52 of the optical integrated circuit 40 and propagates in the waveguide 44.

Then the measuring light propagating in the waveguide 58 reaches the light modulator 42. The measuring light branches off at the branch portion 46 and propagates in the first and second modulation waveguides 48a, 48b. While propagating in the first and second modulation waveguides 48a, 48b, the measuring light is modulated in phase according to the voltage signal to be outputted from the antenna 32, i.e. the voltage applied to the electrodes 36a, 36b.

The antenna 32 is a condenser type consisting of a pair of confronting metallic plates 34a, 34b of the antenna.

Figure 3:
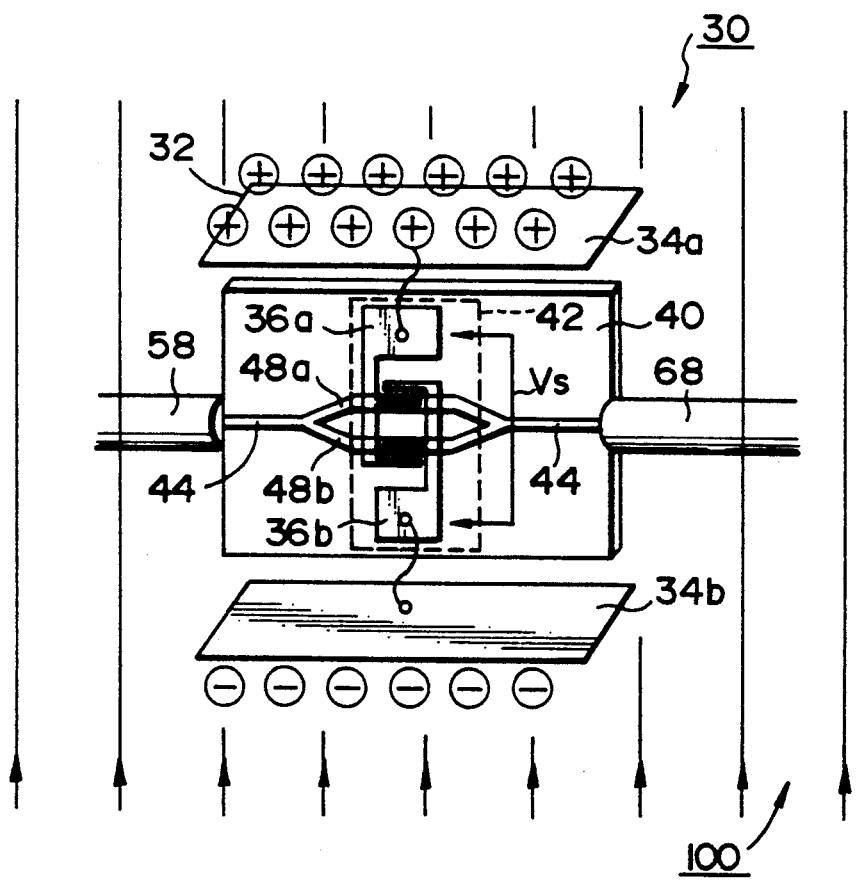
FIG. 3 is a diagram showing the operation of the sensor of FIG. 1.
Figure 5A:
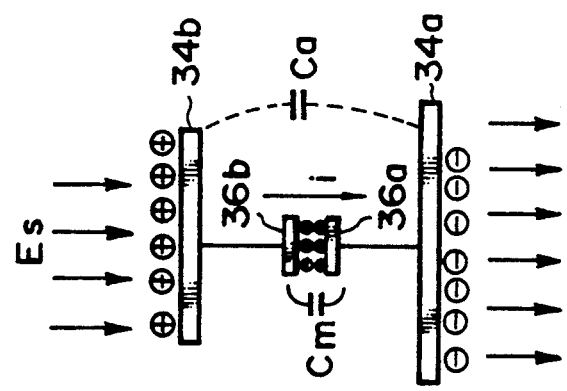
FIGS. 5A and 5B are diagrams showing the operation of a condenser-type antenna.
Figure 5B:
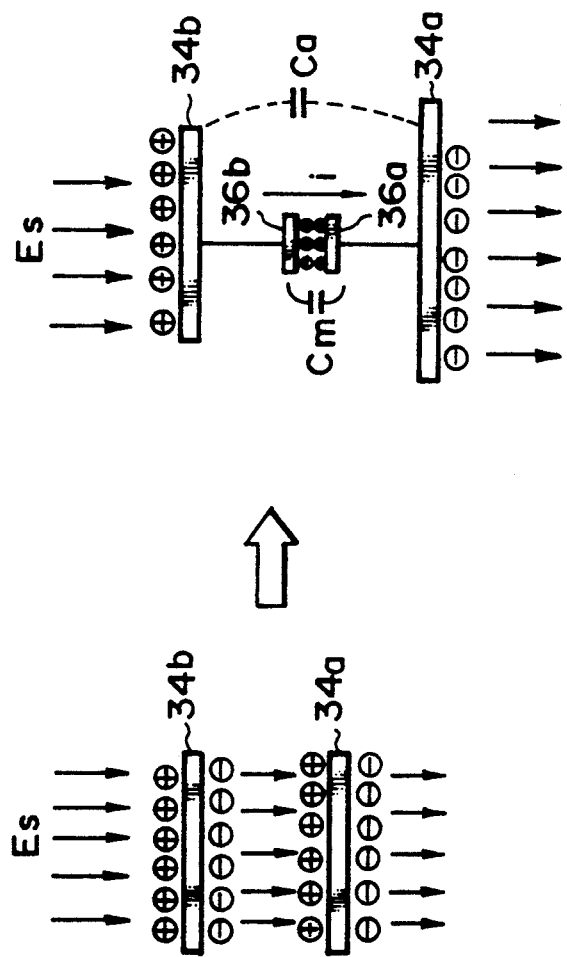

As shown in FIG. 3, in the presence of an electric field in the measuring plate 100, a potential difference $V_s$ is produced between the pair of metallic plates 34a, 34b of the antenna.

Assuming that the electric field in the measuring place 100 is $E_s$, the area of the metallic plates 34a, 34b of the antenna is S and the dielectric constant in vacuoa is $\epsilon_o$, the electric charge Q expressed by the above equation (1) is produced on the one surface of each of the opposite metallic plates 34a, 34b of the antenna.

Assuming that the capacity between the modulation electrodes 36a, 36b is $C_m$, the relation expressed by the above equation (2) is established between the electric charge Q and the potential difference $V_s$.

Therefore, by the change of the electric charge Q with time and by the impedance Z between the electrodes 36a, 36b, the potential difference $V_s$ expressed by the above equation (3) is produced between the electrodes 36a, 36b, where R stands for a parallel resistance of the waveguides 48a, 48b in the light modulator 42 and $\omega$ stands for an angular frequency of the electric field $E_s$.

Thus the measuring light propagating in the first and second modulation waveguides 48a, 48b is modulated in phase according to the voltage $V_s$ expressed by the equation (3).

As is apparent from the equation (3), the lower cut-off frequency during detection of electric field is ($\frac{1}{2}\pi C_m R$), which is determined by the values of $C_m$ and R. At that time, the impedance Z between the electrodes 36a, 36b in the optical integrated circuit 40 is very high. Namely, since $C_m$ is the order of $10^{-12}$ F but it is easy to have R more than $10^{10}$ $\Omega$, it is possible to reduce the lower cut-off frequency to an adequately low value.

For example, by constructing the sensor 30 as shown in FIGS. 6 and 7, it is possible to set the lower cut-off frequency to 30 Hz.

In this embodiment, since the cut-off frequency of the metallic plates 34a, 34b of the antenna constituting a condenser-type antenna can be set to 30 Hz, it is possible to detect the intensity of electric field of a low frequency such as 50 and 60 Hz with good sensitivity and to output to the electrodes 36a, 36b a voltage according to the intensity of the electric field.

In the above equation (3), the sensitivity is represented by $\epsilon_o S/C_m$, from which it is apparent that the sensitivity does not depend on the gap between the metallic plates 34a, 34b of the antenna. Therefore, with the condenser-type antenna 32, it is possible to make the optical integrated circuit 40 very small in size.

The electrodes 36a, 36b apply voltages of opposite signs respectively to the first and second modulation waveguides 48a, 48b. Therefore, the measuring light propagating in the first modulation waveguide 48a and the measuring light propagating in the second modulation waveguide 48b are opposite in sign of change of phase to one another so that a phase difference will occur between them.

The measuring light propagating in the waveguide 48a and the measuring light propagating in the waveguide 48b merge and interfere with one another at the merging point 50, thereby converting the degree of phase difference into the intensity of light. When the phase difference is 0° in the absence of any external electric field, the amount of light will be maximal; and when the phase difference is 180° in the presence of an external electric field, the amount of light will be zero or minimal. Therefore it is possible to measure degree of phase difference and hence the electric field intensity by measuring the intensity of such modulated light.

Figure 8:
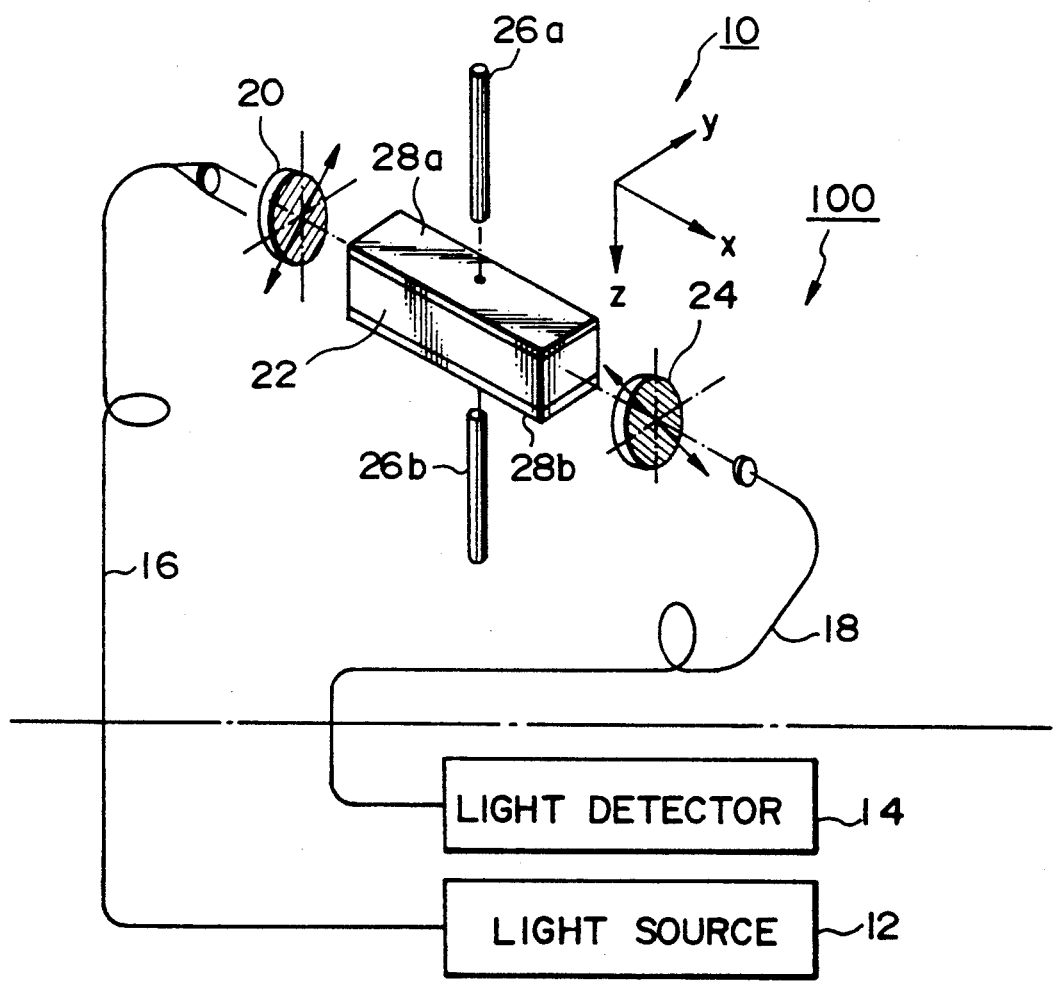
FIG. 8 is a diagram showing a typical conventional apparatus for measuring an electric field intensity.

In this embodiment, partly since the condenser-type antenna 32 is capable of detecting a low-frequency electric field with good sensitivity and partly since the light modulator 42 is formed in the waveguide-type optical integrated circuit 40, it is possible to measure a very-low-frequency electric field such as commercial frequency electric field, which is difficult to measure with the conventional apparatus of FIG. 8.

Further, according to this invention, since the operating voltage will be 1/100, compared to the conventional apparatus using a bulk crystal as shown in FIG. 8, it is possible to sharply improve the measuring sensitivity.

According to this embodiment, partly since the light modulator 42 is formed in the waveguide-type optical integrated circuit 40 and partly since the metallic plates 34a, 34b of the antenna are formed on the same substrate as the optical integrated circuit 40 by photolithography or the like, it is possible to make the sensor 30 sharply smaller in size and weight. This assures a stable operation of the apparatus. Therefore it is possible to perform a good electric field measurement in a small place, which would have been difficult to realize in the conventional art.

With the measuring apparatus of this invention, it is possible to measure the electric field in the measuring place 100 accurately, with substantially no disturbance against the electric field environment.

What is claimed is:

1. An apparatus for measuring an electric field intensity comprising:

light generating means for generating coherent measuring light;

a sensor disposed in the electric field for modulating a measuring light according to the intensity of the electric field and for outputting said modulated light;

an up-link optical fiber connecting between said light generating means and said sensor for guiding said measuring light into said sensor;

a down-link optical fiber for guiding said modulated light outside said sensor; and intensity processing means disposed outside said sensor for processing said intensity of the electric field based on the degree of modulation of said measuring light inputted via said down-link optical fiber; wherein said sensor comprises a condenser-type antenna for detecting the electric field and outputting a voltage according to the intensity of the detected electric field, a waveguide-type optical integrated circuit in which a waveguide for propagating the inputted measuring light is formed, a light modulator, through which said waveguide extends, formed in said optical integrated circuit, and a light modulator electrode for applying the output voltage of said condenser-type antenna to said waveguide of said light modulator, whereby the measuring light is modulated according to the intensity of the electric field while the measuring light is propagated through said waveguide of said light modulator.

2. An apparatus according to claim 1, wherein said waveguide is branched at a branch point into a first modulation waveguide and a second waveguide and merges at a merging point, and said light modulator is adapted to apply positive and negative voltage which are outputted from said condenser-type antenna, to said first and second modulation waveguides respectively via said light modulation electrode to modulate the phases of branched measuring lights propagated through the respective modulation waveguides and to allow both lights to merge and interfere with one another at said merging point, thereby outputting the merging light whose intensity is modulated according to the electric field intensity.

3. An apparatus according to claim 1, wherein said light generating means comprises a laser light source for outputting coherent laser light, and an optical system for inputting said laser light to said up-link optical fiber.

4. An apparatus according to claim 3, wherein said laser light source is a semiconductor laser.

5. An apparatus according to claim 4, wherein said up-link optical fiber is a polarization maintaining fiber.

6. An apparatus according to claim 1, wherein said optical integrated circuit is formed of $LiNbO_3$.

7. An apparatus according to claim 1, wherein said condenser-type antenna comprises a pair of confronting antenna metal plates.

8. An apparatus according to claim 3, wherein said condenser-type antenna comprises a pair of confronting antenna metal plates.

9. An apparatus according to claim 1, wherein said condenser-type antenna is an integrated antenna formed on a substrate of said optical integrated circuit by photolithography.

10. An apparatus according to claim 7, wherein said condenser-type antenna is an integrated antenna formed on a substrate of said optical integrated circuit by photolithography.

11. An apparatus according to claim 1, wherein said intensity processing means comprises a photo detector for converting the measuring light inputted via said down-link optical fiber, into an electrical signal and for outputting the electrical signal, and a signal processing circuit for calculating the intensity of the electric field based on the electrical signal outputted from said photo detector and for outputting said calculated intensity, and said signal processing circuit comprises a low-pass filter for extracting a d.c. component from the output signal of said photo detector and outputting it, a detector for sampling and detecting, from the output signal of said photo detector, a target signal of a predetermined frequency to be measured, and a divider for dividing the output of said detector by the d.c. component outputted from said low-pass filter to eliminate a fluctuated component resulting from disturbance, thereby obtaining the intensity of said electric field.

12. An apparatus according to claim 1, further comprising displaying means for displaying said intensity of the electric field calculated with said intensity processing means.

* * * * *